(12) United States Patent
Choi et al.

(10) Patent No.: US 10,065,860 B2
(45) Date of Patent: Sep. 4, 2018

(54) COMPOSITION FOR FORMING CONDUCTIVE PATTERN AND RESIN STRUCTURE HAVING CONDUCTIVE PATTERN

(71) Applicant: LG CHEM, LTD., Seoul (KR)

(72) Inventors: Kwon Il Choi, Daejeon (KR); Myong Jo Ham, Daejeon (KR); Eon Seok Lee, Daejeon (KR); Cheol-Hee Park, Daejeon (KR); Han Nah Jeong, Daejeon (KR); Jae Hyun Kim, Daejeon (KR); Shin Hee Jun, Daejeon (KR); Eun Kyu Seong, Daejeon (KR)

(73) Assignee: LG Chem, Ltd., Seoul (KR)

( * ) Notice: Subject to any disclaimer, the term of this patent is extended or adjusted under 35 U.S.C. 154(b) by 0 days.

(21) Appl. No.: 15/505,535

(22) PCT Filed: Sep. 17, 2015

(86) PCT No.: PCT/KR2015/009784
§ 371 (c)(1),
(2) Date: Feb. 21, 2017

(87) PCT Pub. No.: WO2016/043540
PCT Pub. Date: Mar. 24, 2016

(65) Prior Publication Data
US 2017/0267526 A1 Sep. 21, 2017

(30) Foreign Application Priority Data

Sep. 17, 2014 (KR) .................. 10-2014-0123893
Sep. 16, 2015 (KR) .................. 10-2015-0130982

(51) Int. Cl.
| | | |
|---|---|---|
| *C08F 2/40* | (2006.01) | |
| *C08F 2/00* | (2006.01) | |
| *C08G 61/04* | (2006.01) | |
| *C01B 15/16* | (2006.01) | |
| *C01G 3/00* | (2006.01) | |
| *C01G 55/00* | (2006.01) | |
| *C08L 55/02* | (2006.01) | |
| *C08G 75/0209* | (2016.01) | |
| *C08G 65/38* | (2006.01) | |

(52) U.S. Cl.
CPC .............. *C01B 15/16* (2013.01); *C01G 3/006* (2013.01); *C01G 55/004* (2013.01); *C08G 75/0209* (2013.01); *C08L 55/02* (2013.01); *C01P 2002/30* (2013.01); *C01P 2004/38* (2013.01); *C08G 65/38* (2013.01); *C08L 2205/24* (2013.01)

(58) Field of Classification Search
CPC .... C01B 15/16; C08G 75/0209; C08G 65/38; C01P 2002/30; C01P 2004/38; C01G 55/004; C01G 3/006; C08L 2205/24; C08L 55/02
USPC ................................... 526/90, 89, 72; 520/1
See application file for complete search history.

(56) References Cited

U.S. PATENT DOCUMENTS

| | | |
|---|---|---|
| 8,546,066 B2 | 10/2013 | Irisawa et al. |
| 2004/0241422 A1 | 12/2004 | Naundorf et al. |
| 2005/0069688 A1 | 3/2005 | Kliesch et al. |
| 2005/0163987 A1 | 7/2005 | Kliesch et al. |
| 2006/0019076 A1 | 1/2006 | Kim et al. |
| 2008/0081207 A1 | 4/2008 | Ohsaki et al. |
| 2009/0277672 A1 | 11/2009 | Matsumoto |
| 2009/0292051 A1 | 11/2009 | Li et al. |
| 2011/0281135 A1 | 11/2011 | Gong et al. |
| 2012/0065313 A1 | 3/2012 | Demartin Maeder et al. |
| 2012/0082834 A1 | 4/2012 | Wermter et al. |
| 2012/0279764 A1 | 11/2012 | Jiang et al. |
| 2013/0106659 A1 | 5/2013 | Yung et al. |
| 2013/0136869 A1 | 5/2013 | Hamilton et al. |
| 2013/0289178 A1 | 10/2013 | Li et al. |
| 2014/0353543 A1 | 12/2014 | Wu et al. |
| 2017/0275764 A1* | 9/2017 | Kim ................... C23C 18/20 |

FOREIGN PATENT DOCUMENTS

| | | |
|---|---|---|
| CN | 1518850 A | 8/2004 |
| CN | 101278607 A | 10/2008 |
| CN | 101747650 A | 6/2010 |
| CN | 102066122 A | 5/2011 |
| CN | 102093713 A | 6/2011 |
| CN | 102714163 A | 10/2012 |
| CN | 103053227 A | 4/2013 |
| CN | 103741125 A | 4/2014 |

(Continued)

OTHER PUBLICATIONS

Florian Norindr, "Study of Inorganic Transparent Materials with Near-Infrared Absorbing Properties", University of Southampton, School of Chemistry, Doctoral Thesis, Sep. 2009.

(Continued)

*Primary Examiner* — Jessica Whiteley
(74) *Attorney, Agent, or Firm* — Dentons US LLP

(57) ABSTRACT

The present invention relates to a composition for forming conductive patterns and a resin structure having a conductive pattern, capable of forming a conductive micropattern on various polymer resin products or resin layers using a simplified process and exhibiting excellent heat dissipation characteristics. The composition for forming conductive patterns comprises: a polymer resin; a non-conductive metal compound represented by a specific chemical formula; and a heat-dissipating material, wherein a metal nucleus is formed from the non-conductive metal compound by the irradiation of electromagnetic waves.

14 Claims, 10 Drawing Sheets

(56) References Cited

FOREIGN PATENT DOCUMENTS

| | | |
|---|---|---|
| CN | 103906803 A | 7/2014 |
| DE | 102011003651 A1 | 8/2012 |
| JP | 2005-97617 A | 4/2005 |
| JP | 2005-213500 A | 8/2005 |
| JP | 2006307084 A | 11/2006 |
| JP | 2007-287994 A | 11/2007 |
| JP | 2008089821 A | 4/2008 |
| JP | 2008163288 A | 7/2008 |
| JP | 2008307084 A | 12/2008 |
| JP | 2012519230 A | 8/2012 |
| JP | 2015229743 A | 12/2015 |
| KR | 10-2006-0007503 A | 1/2006 |
| KR | 10-0716486 B1 | 5/2007 |
| KR | 10-2011-0018319 A | 2/2011 |
| KR | 10-2011-0112860 A | 10/2011 |
| KR | 10-1121707 B1 | 3/2012 |
| KR | 10-1131145 B1 | 4/2012 |
| KR | 10-1333974 B1 | 11/2013 |
| KR | 10-1391187 B1 | 5/2014 |
| KR | 10-1399979 B1 | 6/2014 |
| KR | 10-1434423 B1 | 8/2014 |
| KR | 10-2014-0124918 A | 10/2014 |
| KR | 10-2015-0077609 A | 7/2015 |

OTHER PUBLICATIONS

K. Pogorzelec-Glaser et al., "Structure and phase transitions in $Cu_2P_2O_7$", Phase Transitions: A Multinational Journal, vol. 79, Nos. 6-7, pp. 535-544.

Robertson et al., Acta Crystallographica. vol. 22, No. 5, May 1, 1967, pp. 665-672 (1967).

Robertson et al., Canadian Journal of Chemistry, vol. 46, No. 605, Feb. 28, 1968 pp. 605-612 (1968).

Boukhari et al., Journal of Solid State Chemistry, vol. 87, No. 2, Aug. 1, 1990, pp. 251-256 (1990).

Maadi et al., Journal of Alloys and Compounds, vol. 205, No. 1-2, Mar. 1, 1994, pp. 243-247 (1994).

Bettach et al., Advanced Materials Research, vol. 1-2, Sep. 29, 1994, pp. 543-552 (1994).

Bamberger, Journal of American Ceramic Society, vol. 81, No. 1, Jan. 31, 1998, pp. 252-256 (1998).

Serghini et al., Materials Letters, vol. 22, Jan. 31, 1995, pp. 149-153 (1995).

\* cited by examiner

COMPOSITION FOR FORMING CONDUCTIVE PATTERN AND RESIN STRUCTURE HAVING CONDUCTIVE PATTERN

CROSS-REFERENCE TO RELATED APPLICATION

This application is a National Stage Application of International Application No. PCT/KR2015/009784 filed on Sep. 17, 2015, which claims the benefit of Korean Patent Application No. 10-2014-0123893 filed on Sep. 17, 2014 and Korean Patent Application No. 10-2015-0130982 filed on Sep. 16, 2015, all of which are hereby incorporated by reference in their entirety for all purposes as if fully set forth herein.

BACKGROUND OF THE INVENTION (a) Field of the Invention

The present invention relates to a composition for forming a conductive pattern and a resin structure having a conductive pattern, capable of forming a fine conductive pattern on various polymer resin products or resin layers using a simplified process and exhibiting excellent heat dissipation characteristics.

(b) Description of the Related Art

With the recent development of microelectronic technology, a need for structures having a fine conductive pattern which is formed on a surface of a polymer resin substrate (or product) such as a variety of resin products or resin layers has grown. The conductive pattern on the surface of the polymer resin substrate may be applied to form various objects such as antennas integrated into an electronic device case, a variety of sensors, MEMS structures, RFID tags, or various circuit substrates, etc.

As described above, with increasing interest in the technology of forming the conductive pattern on the surface of the polymer resin substrate, several technologies regarding this were suggested. However, a method capable of more effectively using these technologies has not been suggested yet.

For example, according to the previously known technology, a method of forming the conductive pattern by forming a metal layer on the surface of the polymer resin substrate and then applying photolithography, or a method of forming the conductive pattern by printing a conductive paste, etc., may be considered. However, when the conductive pattern is formed according to this technology, there are disadvantages that a process or equipment to be needed becomes too complicated, or it is difficult to form an excellent fine conductive pattern.

Accordingly, there is a continuous need to develop a technology capable of more effectively forming the fine conductive pattern on the surface of the polymer resin substrate using a simplified process.

On the other hand, various electric/electronic products and automobile components have a problem in that a temperature of the conductive circuit board is increased due to high integration of elements, adoption of a heating element, etc., which deteriorates overall performance and reduces safety and life span. Accordingly, a highly heat dissipation structure is essentially adopted for various electric/electronic products and automobile components to solve such a problem. However, it is not able to keep up with the recent trend of miniaturization and light weight of an electronic device, and a manufacturing process is complicated due to a heat dissipation plate such as metal aluminum which is commonly used. Accordingly, there is a need to develop a technology for achieving light weight and miniaturization while exhibiting existing functions of the electronic device as they are.

The above information disclosed in this Background section is only for enhancement of understanding of the background of the invention and therefore it may contain information that does not form the prior art that is already known in this country to a person of ordinary skill in the art.

SUMMARY OF THE INVENTION

The present invention has been made in an effort to provide a composition for forming a conductive pattern having advantages of forming a fine conductive pattern on various polymer resin products or resin layers using a simplified process and exhibiting excellent heat dissipation characteristics.

In addition, the present invention has been made in an effort to provide a resin structure having a conductive pattern formed by a method of forming a conductive pattern, from the composition for forming a conductive pattern.

An exemplary embodiment of the present invention provides a composition for forming a conductive pattern by irradiation of electromagnetic waves including: a polymer resin; a non-conductive metal compound including at least one phosphate selected from the group consisting of phosphates represented by Chemical Formulas 1 to 4 below; and a carbide, a carbon-based material, a nitride-based material, a metal oxide, or a mixture thereof as a heat-dissipating material, wherein a metal nucleus is formed from the non-conductive metal compound by the irradiation of the electromagnetic waves:

$A_xB_2P_3O_{12}$ [Chemical Formula 1]

$Cu_{3-y}M^1{}_yP_2O_8$ [Chemical Formula 2]

$Cu_{2-z}M^2{}_zP_2O_7$ [Chemical Formula 3]

$Cu_4P_2O_9$ [Chemical Formula 4]

in Chemical Formula 1, x is a rational number from 0.5 to 1, A is at least one metal selected from the group consisting of Li, Na, Cu, Ag and Au, and B is at least one metal selected from the group consisting of Sn, Ti, Zn and Hf, in Chemical Formula 2, y is a rational number from 0 to less than 3, $M^1$ is at least one metal selected from the group consisting of Ti, V, Cr, Mn, Fe, Co, Ni, Y, Zn, Nb, Mo, Tc, Pd, Ag, Ta, W, Pt and Au, and in Chemical Formula 3, z is a rational number from 0 to less than 2, $M^2$ is at least one metal selected from the group consisting of Zn, Mg, Ca, Sr and Ba.

As an example of the phosphate represented by Chemical Formula 1, a phosphate having a trigonal structure of $R\bar{3}c$ space group may be used. In addition, as another example of the phosphate represented by Chemical Formula 1, a phosphate having a triclinic structure of $P\bar{1}$ space group or a monoclinic structure of Cc or C2/c space group may be used.

Meanwhile, as the phosphate represented by Chemical Formula 2, a phosphate having a triclinic structure of $P\bar{1}$ space group may be used. As the phosphate represented by Chemical Formula 3, a phosphate including a structure in which Cu or $M^2$ is surrounded by five oxygen atoms in a distorted square pyramid form; or a structure in which Cu or M is surrounded by six oxygen atoms in a distorted octahedron form may be used. As the phosphate represented by Chemical Formula 4, a phosphate having a triclinic structure of P$\bar{1}$ space group or an orthorhombic structure of Pnma space group may be used.

The non-conductive metal compound may have an average particle size of 0.1 to 6 μm.

Meanwhile, the heat-dissipating material may include silicon carbide as the carbide; carbon black, carbon nanotube, graphite, graphene, or a mixture thereof as the carbon-based material; boron nitride, silicon nitride, aluminum nitride or a mixture thereof as the nitride-based material; or magnesium oxide, aluminum oxide, beryllium oxide, zinc oxide, or a mixture thereof as the metal oxide.

In the composition for forming a conductive pattern according to an embodiment of the present invention, the polymer resin may include a thermosetting resin or a thermoplastic resin. As an example, the polymer resin may include at least one selected from the group consisting of an acrylonitrile poly-butadiene styrene (ABS) resin, a polyalkylene terephthalate resin, a polyamide resin, a polyphenylether resin, a polyphenylene sulfide resin, a polycarbonate resin, a polypropylene resin, and a polyphthalamide resin.

Further, the composition for forming a conductive pattern according to an embodiment may include 0.1 to 10 wt % of the non-conductive metal compound based on the total composition, 1 to 50 wt % of the heat-dissipating material based on the total composition, and a residual content of the polymer resin.

In addition, the composition for forming a conductive pattern according to an embodiment may further include at least one additive selected from the group consisting of a flame retardant, a heat stabilizer, a ultraviolet (UV) stabilizer, a lubricant, an anti-oxidant, an inorganic filler, a color additive, an impact-reinforcing agent, and a functional reinforcing agent.

On the other hand, another exemplary embodiment of the present invention provides a resin structure having a conductive pattern including: a polymer resin substrate; a non-conductive metal compound including at least one phosphate selected from the group consisting of phosphates represented by Chemical Formulas 1 to 4 below dispersed in the polymer resin substrate; a carbide, a carbon-based material, a nitride-based material, a metal oxide or a mixture thereof as a heat-dissipating material dispersed in the polymer resin substrate; an adhesion-activated surface including a metal nucleus exposed on a surface of a predetermined region of the polymer resin substrate; and a conductive metal layer formed on the adhesion-activated surface:

$A_xB_2P_3O_{12}$      [Chemical Formula 1]

$Cu_{3-y}M^1{}_yP_2O_8$      [Chemical Formula 2]

$Cu_{2-z}M^2{}_zP_2O_7$      [Chemical Formula 3]

$Cu_4P_2O_9$      [Chemical Formula 4]

in Chemical Formula 1, x is a rational number from 0.5 to 1, A is at least one metal selected from the group consisting of Li, Na, Cu, Ag and Au, and B is at least one metal selected from the group consisting of Sn, Ti, Zn and Hf, in Chemical Formula 2, y is a rational number from 0 to less than 3, $M^1$ is at least one metal selected from the group consisting of Ti, V, Cr, Mn, Fe, Co, Ni, Y, Zn, Nb, Mo, Tc, Pd, Ag, Ta, W, Pt and Au, and in Chemical Formula 3, z is a rational number from 0 to less than 2, $M^2$ is at least one metal selected from the group consisting of Zn, Mg, Ca, Sr and Ba.

In the resin structure according to another embodiment, the predetermined region in which the adhesion-activated surface and the conductive metal layer are formed may correspond to a region irradiated with electromagnetic waves on the polymer resin substrate.

According to the present invention, the composition for forming a conductive pattern capable of forming a fine conductive pattern on various polymer resin substrates such as polymer resin products, resin layers, etc., using a very simplified process of irradiating electromagnetic waves such as a laser, etc., and the resin structure having a conductive pattern formed from the composition, may be provided.

Particularly, when the composition for forming a conductive pattern is used, a resin structure in which a heat dissipation structure is integrated may be molded, a good conductive pattern may be easily formed on such a resin structure while more effectively satisfying the demand in the art to realize various colors of the resin structure (various polymer resin products or resin layers, etc.).

Therefore, the composition for forming a conductive pattern, etc., may be used to very effectively form conductive circuit patterns on various resin products such as electric/electronic products, automobile components, etc., RFID tags, various sensors, MEMS structures, etc.

DETAILED DESCRIPTION OF THE EMBODIMENTS

Figure 1:
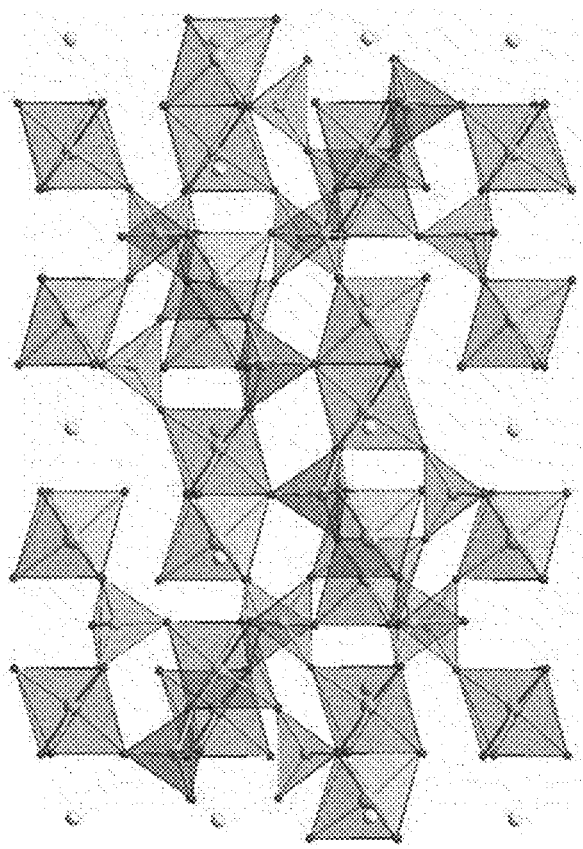
FIG. 1 schematically shows a nasicon steric structure of an example of a phosphate represented by Chemical Formula 1 included in a composition for forming a conductive pattern according to an embodiment.

Hereinafter, a composition for forming a conductive pattern according to a specific embodiment of the present invention, and a resin structure having a conductive pattern formed therefrom, etc., are described.

According to an embodiment of the present invention, there is provided a composition for forming a conductive pattern by irradiation of electromagnetic waves including: a polymer resin; a non-conductive metal compound including at least one phosphate selected from the group consisting of phosphates represented by Chemical Formulas 1 to 4 below; and a carbide, a carbon-based material, a nitride-based material, a metal oxide, or a mixture thereof as a heat-dissipating material, wherein a metal nucleus is formed from the non-conductive metal compound by the irradiation of the electromagnetic waves.

$A_xB_2P_3O_{12}$ [Chemical Formula 1]

$Cu_{3-y}M^1{}_yP_2O_8$ [Chemical Formula 2]

$Cu_{2-z}M^2{}_zP_2O_7$ [Chemical Formula 3]

$Cu_4P_2O_9$ [Chemical Formula 4]

in Chemical Formula 1, x is a rational number from 0.5 to 1, A is at least one metal selected from the group consisting of Li, Na, Cu, Ag and Au, and B is at least one metal selected from the group consisting of Sn, Ti, Zn and Hf, in Chemical Formula 2, y is a rational number from 0 to less than 3, $M^1$ is at least one metal selected from the group consisting of Ti, V, Cr, Mn, Fe, Co, Ni, Y, Zn, Nb, Mo, Tc, Pd, Ag, Ta, W, Pt and Au, and in Chemical Formula 3, z is a rational number from 0 to less than 2, $M^2$ is at least one metal selected from the group consisting of Zn, Mg, Ca, Sr and Ba.

When the composition for forming a conductive pattern including the non-conductive metal compound is used to mold a polymer resin product or a resin layer, and irradiated with electromagnetic waves such as a laser, etc., the metal nucleus may be formed from the non-conductive metal compound. The metal nucleus may be selectively exposed in a predetermined region irradiated with the electromagnetic waves to form an adhesion-activated surface on a surface of the polymer resin substrate. Then, when the metal nucleus, etc., are used as a seed, and are subjected to electroless plating with a plating solution including a conductive metal ion, etc., a conductive metal layer may be formed on the adhesion-activated surface including the metal nucleus. Through this process, the conductive metal layer, i.e., a fine conductive pattern may be selectively formed only on the predetermined region of the polymer resin substrate irradiated with the electromagnetic waves.

Particularly, one of main factors in which it is possible to form the metal nucleus and the adhesion-activated surface, thereby forming a more excellent conductive pattern by the irradiation of the electromagnetic waves, may be a specific steric structure of the non-conductive metal compound included in the composition of an embodiment. Hereinafter, the steric structure of the phosphate that is usable as the non-conductive metal compound according to an embodiment, and optical characteristics according to such structural characteristics are described in detail.

The phosphate represented by Chemical Formula 1 may have a space group of various crystalline structures depending on a position of a metal A in a basic structure in which $PO_4$ tetrahedron and $BO_6$ octahedron are three-dimensionally connected while sharing oxygens.

As an example, the phosphate in which x of Chemical Formula 1 is 1 may have a trigonal structure of $R\bar{3}c$ space group (nasicon steric structure) as shown in FIG. 1.

Referring to FIG. 1, in the phosphate having the nasicon structure, the $BO_6$ octahedron and the $PO_4$ tetrahedron are three-dimensionally connected while sharing oxygens (i.e., a three-dimensional steric structure framework of the entire nasicon structure is formed), and may have a steric structure in which the metal A or ion thereof is positioned in a channel formed by a crystal lattice arrangement of the octahedron and the tetrahedron.

More specifically, in the nasicon steric structure, the channel may be formed in a site surrounded by six oxygens along a c-axis of a crystal lattice, and the site may be partially filled with the metal A or the ion. Accordingly, the metal A may be freely present even in restriction of any crystal lattice in the steric structure, and thus, it is predicted that when the non-conductive metal compound having the steric structure is exposed to a stimulation of the electromagnetic wave in a specific wavelength, the metal A or the ion may be easily separated from the material. In a specific example, it is confirmed that when the non-conductive metal compound such as $CuSn_2(PO_4)_3$ is exposed to the electromagnetic waves such as a laser, etc., even though it basically has chemical stability, Cu or $Cu^{1+}$ may be easily separated to form metal nucleus, and it may be expected that the formation is caused by the specific three-dimensional structure of the nasicon steric structure described above.

Figure 2:
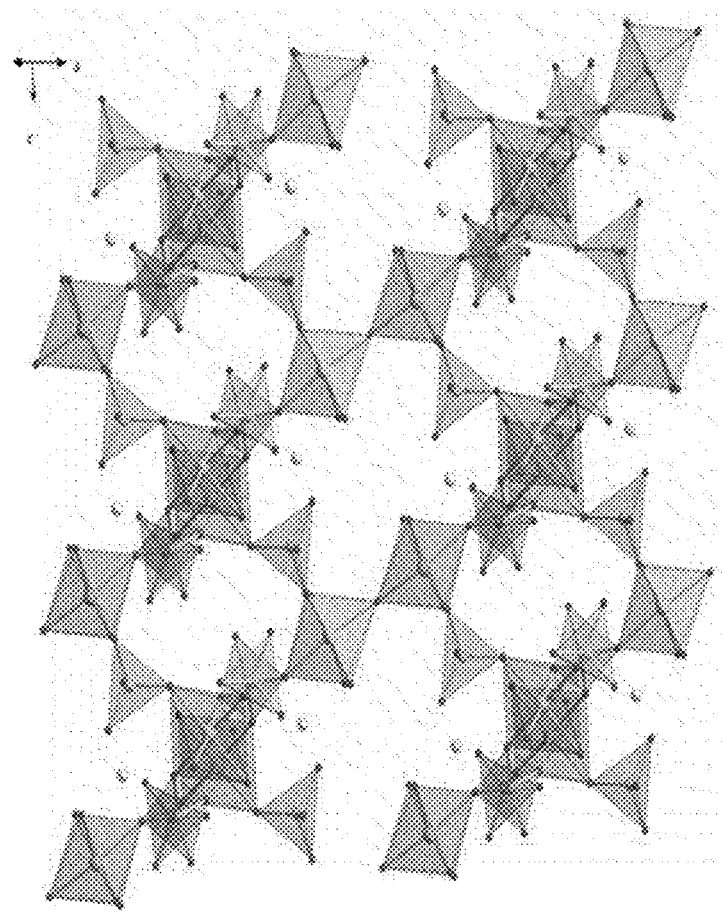
FIG. 2 schematically shows a steric structure belonging to a triclinic structure of P$\bar{1}$ space group of the phosphate represented by Chemical Formula 1 included in a composition for forming a conductive pattern according to another embodiment.

On the other hand, the phosphate represented by Chemical Formula 1 having a nasicon steric structure may have a triclinic structure of $P\bar{1}$ space group or a monoclinic structure of Cc or C2/c space group by phase transition, which is shown in FIG. 2.

When the center of the channel formed by two $PO_4$ tetrahedrons and four $BO_6$ octahedrons in the $R\bar{3}c$ structure is 0 0 0, if symmetry of the crystal structure is lowered to C2/c, this site may be changed to ¼ ¼ 0, ¾ ¼ ½, ¾ ¾ 0, ¼ ¾ ½, and an element A may be positioned thereon while sharing four oxygens. $R\bar{3}c$. However, the element A does not exist at all of these sites, and may exist only in some sites.

In addition, when the crystal structure is Cc, a site of ¼ ¼ 0, ¾ ¼ ½ where the symmetry by 2-fold disappears may be an M1 site in which two oxygen are capable of being shared, and a site of ¾ ¾ 0, ¼ ¾ ½ May be an M2 Site in which four oxygens are shared as in the case of C2/c. In addition, in most of the $P\bar{1}$ structure, the element A is positioned only in a portion of the M2 site. In addition, when the element A is a transition metal element such as Cu, an oxidation number may be changed from monovalence to divalence. Accordingly, in Chemical Formula 1, x has a value of 0.5 to 1.

The crystal structure of the phosphate represented by Chemical Formula 1 may be determined according to the phase transition occurring depending on a firing temperature during synthesis of the phosphate and the kinds of the metal included in the phosphate.

In general, when a firing process is performed at a high temperature of about 1000° C. or more to synthesize the phosphate represented by Chemical Formula 1, the non-conductive metal compound having a trigonal structure of $R\bar{3}c$ space group which is a stable phase may be obtained.

On the other hand, when the firing process is performed at a low temperature of about 1000° C. or less to synthesize the phosphate represented by Chemical Formula 1, the phosphate represented by Chemical Formula 1 belonging to the triclinic structure of $P\bar{1}$ space group or the phosphate represented by Chemical Formula 1 belonging to the monoclinic structure of Cc or C2/c space group which has lower symmetry than that of the trigonal structure, may be obtained.

However, even when the low-temperature firing is used, the non-conductive metal compound partially having the trigonal structure of $R\bar{3}c$ space group may be synthesized, or when the high-temperature firing is used, the non-conductive metal compound partially having the triclinic structure of $P\bar{1}$ space group or the monoclinic structure of Cc or C2/c space group may be synthesized.

Similar to the phosphate represented by Chemical Formula 1 having the above-described nasicon structure, when a composition for forming a conductive pattern including the phosphate represented by Chemical Formula 1 having the $P\bar{1}$ space group, the Cc or C2/c space group is used to mold a polymer resin product or a resin layer, and then, a predetermined region is irradiated with electromagnetic waves such as a laser, etc., a metal nucleus may be formed from the phosphate having the above-described structure. The phosphate represented by Chemical Formula 1 having the $P\bar{1}$ space group, the Cc or C2/c space group is chemically stable in a general environment. However, in the region irradiated with electromagnetic waves in a specific wavelength, a metal present in the site A or an ion thereof may be easily separated from the material. Therefore, the metal nucleus may be more easily formed by the irradiation of the electromagnetic waves.

Figure 3:
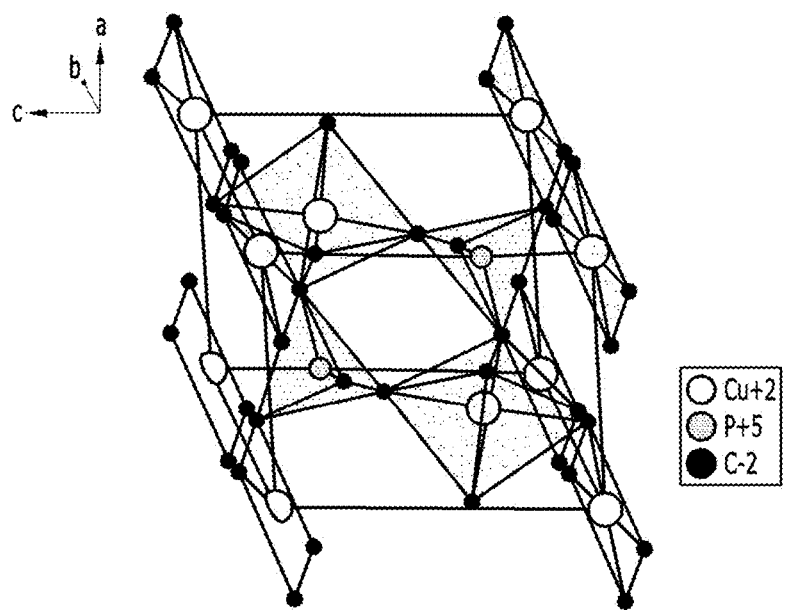
FIG. 3 schematically shows a steric structure belonging to a triclinic structure of P$\bar{1}$ space group of a phosphate represented by Chemical Formula 2 included in a composition for forming a conductive pattern according to still another embodiment.

Next, the phosphate represented by Chemical Formula 2 may have a triclinic structure having the smallest symmetry among 7 crystal systems. In the triclinic structure, not only lengths of three vectors constituting a unit cell are different ($a\neq b\neq c$), but also angles formed by the vectors are different and are not perpendicular ($\alpha\neq\beta\neq\gamma\neq 90$). In addition, the phosphate represented by Chemical Formula 2 may be included in the $P\bar{1}$ space group. FIG. 3 schematically shows the triclinic structure of the non-conductive metal compound.

Referring to FIG. 3, Cu and $M^1$ in the non-conductive metal compound having a triclinic structure may be positioned in two sites. Specifically, the non-conductive metal compound may be positioned in the M1 site in which one Cu or $M^1$ is coordinated by four oxygens to form a local symmetry of a square plane, and in the M2 site in which one Cu or $M^1$ is coordinated by five oxygens to form a local symmetry of a trigonal bipyramid. Further, the non-conductive metal compound may include a $PO_4$ tetrahedron in which one P is coordinated by four oxygens to form local symmetry. The sites that form the local symmetry may be three-dimensionally connected while sharing oxygens to form the triclinic structure as shown in FIG. 3. Specifically, the non-conductive metal compound may have a steric structure in which square planar $CuO_4$ or $MO_4$; trigonal bipyramidal $CuO_5$ or $MO_5$; and tetrahedral $PO_4$ are three-dimensionally connected while sharing oxygens, as shown in FIG. 3.

Figure 4:
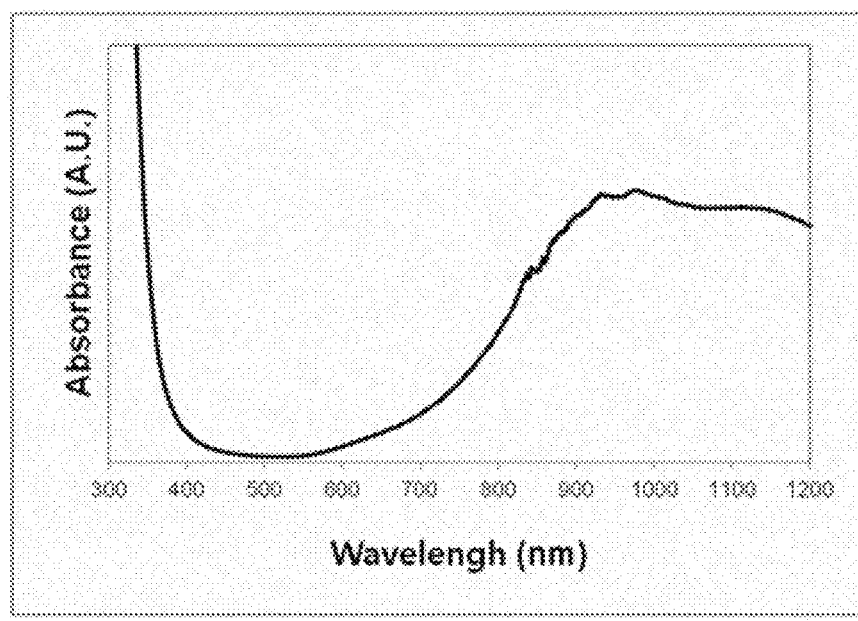
FIG. 4 is a graph showing absorbance according to a wavelength (nm) of the phosphate represented by Chemical Formula 2 according to an embodiment. The absorbance is calculated by $(1-R\ \%*0.01)^2/(2R\ \%*0.01)$ according to Kubelka-Munk equation, and R % is a diffuse reflectance which may be measured by UV-visible spectroscopy.

In addition, the phosphate represented by Chemical Formula 2 has a low absorbance in a visible light region (about 300 nm to 700 nm) and a high absorbance in a near infrared region to an infrared region (about 700 nm to 3,000 nm), as shown in FIG. 4 (horizontal axis: wavelength (nm), vertical axis: absorbance). The strong absorbance of the near infrared region of the phosphate is resulted from the local symmetry of the trigonal bipyramid formed by $CuO_5$. A first reason thereof is because $Cu^{2+}$ existing in the center of the trigonal bipyramid is positioned in a non-centrosymmetric site, and thus, Laporte allowed transition is achieved in d-orbitals of $Cu^{2+}$. A second reason thereof is because transition between energy levels resulted from this crystal structure includes a small content of the visible light region (about 300 nm to 700 nm) and a considerable content of the near infrared region to infrared region (about 700 nm to 3000 nm). Accordingly, the non-conductive metal compound has a low absorbance in the visible light region and a high absorbance in the near infrared region to the infrared region, thereby having a bright color, and being reacted well to the stimulation of the electromagnetic wave having a near infrared wavelength, and thus, the metal nucleus may be easily formed.

Next, the steric structure and optical characteristics of the phosphate represented by Chemical Formula 3 are described. In general, optical characteristics of a compound including a transition metal are related to an energy level of d-orbitals. When the transition metal is present as a free atom, all of the d-orbitals of the transition metal have equivalent energy levels, but when a ligand is present, the energy level of d-orbitals of the transition metal is divided into several depending on the local symmetry formed between the metal atom and the ligand (a crystalline field theory). Here, when the d-orbitals of the transition metal atom are not all charged with electrons, electrons at a low energy level move to a high energy level, which is called a d-d transition of the transition metal.

Since the phosphate represented by Chemical Formula 3 includes $Cu^{2+}$ in which electrons are filled in a portion of the d-orbitals, and thus, the phosphate represented by Chemical Formula 3 may exhibit optical characteristics by the d-d transition. In particular, the transition between the energy levels resulted from the structure represented by Chemical Formula 3 includes a small content of the visible light region (about 300 nm to 700 nm), and a considerable content of the near infrared region to the infrared region (about 700 nm to 3000 nm), and thus, the phosphate represented by Chemical Formula 3 may have a low absorbance in the visible light region (about 300 nm to 700 nm), and a high absorbance in the near infrared region to the infrared region (about 700 nm to 3000 nm).

Specifically, the number of ligands of Cu or $M^2$; and a structure formed between the Cu or $M^2$ and the ligand may be changed depending on $M^2$ in Chemical Formula 3.

Figure 5:
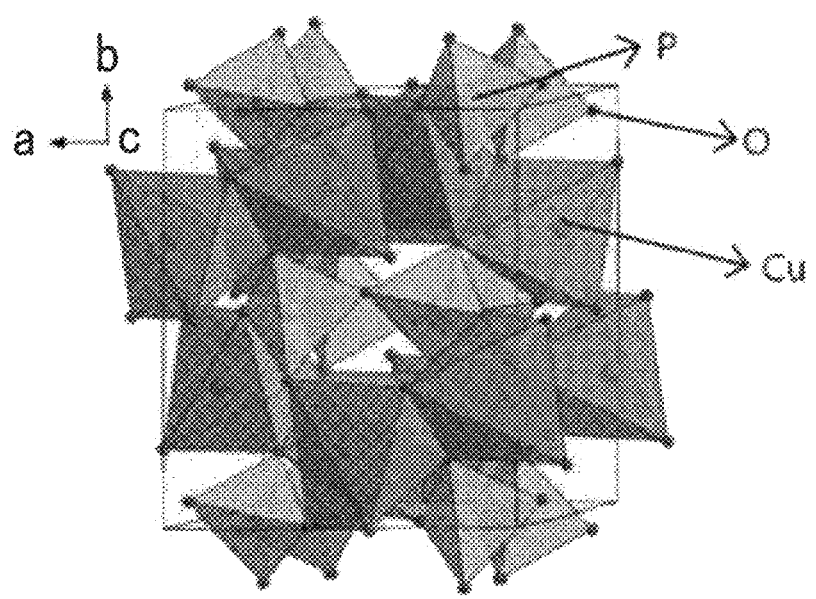
FIG. 5 is schematically shows a steric structure of $Cu_2P_2O_7$ in a phosphate represented by Chemical Formula 3 included in a composition for forming a conductive pattern according to still another embodiment.

As an example, when z satisfies 0<z<2, and $M^2$ is at least one metal selected from the group consisting of Ca, Sr and Ba; or z is 0 in Chemical Formula 3, the phosphate represented by Chemical Formula 3 may include a structure in which Cu or $M^2$, which is the central atom of the local symmetry, is surrounded by five oxygen atoms in a distorted square pyramid form. FIG. 5 schematically shows a structure of $Cu_2P_2O_7$, which is an example of the phosphate represented by Chemical Formula 3.

In addition, as another example, when z in Chemical Formula 3 satisfies 0<z<2, and $M^2$ in Chemical Formula 3 is at least one metal selected from the group consisting of Zn and Mg, the phosphate represented by Chemical Formula 3 may include a structure in which Cu or M, which is the central atom of the local symmetry, is surrounded by six oxygen atoms in a distorted octahedron form.

In such structures, the d-orbital energy level of $Cu^{2+}$ may be formed to absorb electromagnetic waves in the near infrared region. Accordingly, the phosphate represented by Chemical Formula 3 may easily form the metal nucleus by the electromagnetic waves in the near infrared region.

In particular, $Cu^{2+}$ existing in the center of the distorted square pyramid is positioned in the non-centrosymmetric site, and thus, the Laporte allowed transition is achieved in the d-orbitals of $Cu^{2+}$. As a result, when z in Chemical Formula 3 is 0; or when z satisfies 0<z<2, and $M^2$ in Chemical Formula 3 is at least one metal selected from the group consisting of Ca, Sr and Ba, the phosphate represented by Chemical Formula 3 exhibits a strong absorption band in the near infrared region, and thus, the metal nucleus may be more easily formed by the electromagnetic waves in the near infrared region.

Next, the steric structure of the phosphate represented by Chemical Formula 4 is described. The phosphate represented by Chemical Formula 4 may have a steric structure included in the triclinic structure of $P\bar{1}$ space group or the orthorhombic structure of Pnma space group. The $P\bar{1}$ space group structure and the Pnma space group structure according to an example of $Cu_4P_2O_9$ are schematically shown in FIGS. 6 and 7, respectively.

Figure 6:
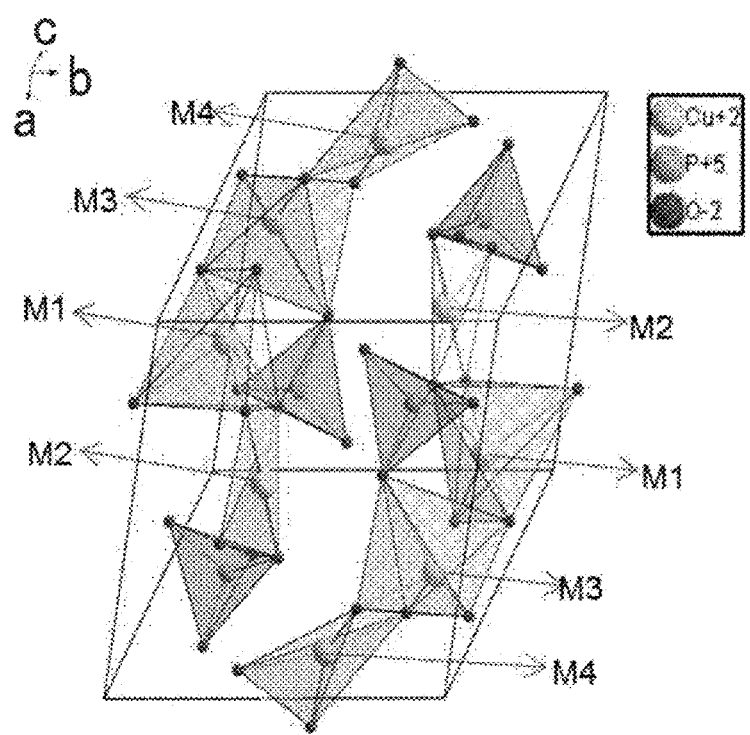
FIG. 6 schematically shows a steric structure belonging to a P$\bar{1}$ space group of a phosphate represented by Chemical Formula 4 included in a composition for forming a conductive pattern according to still another embodiment.

Referring to FIG. 6, copper ions in $Cu_4P_2O_9$ of Chemical Formula 4 may be positioned at M1, M2, M3, and M4 sites, and the copper ions positioned at the M1 and M3 sites may be coordinated by five oxygens to form a local symmetry of a pentahedron, and the copper ions positioned at the M2 and M4 sites may be coordinated by four oxygens to form the local symmetry of the square plane. In addition, P may achieve the local symmetry of the tetrahedron together with four oxygens. The $Cu_4P_2O_9$ may have a steric structure in which the pentahedral $CuO_5$, the square planar $CuO_4$, and the tetrahedral $PO_4$ are three-dimensionally connected while sharing oxygens. The steric structure may be referred to as a $P\bar{1}$ space group structure.

Figure 7:
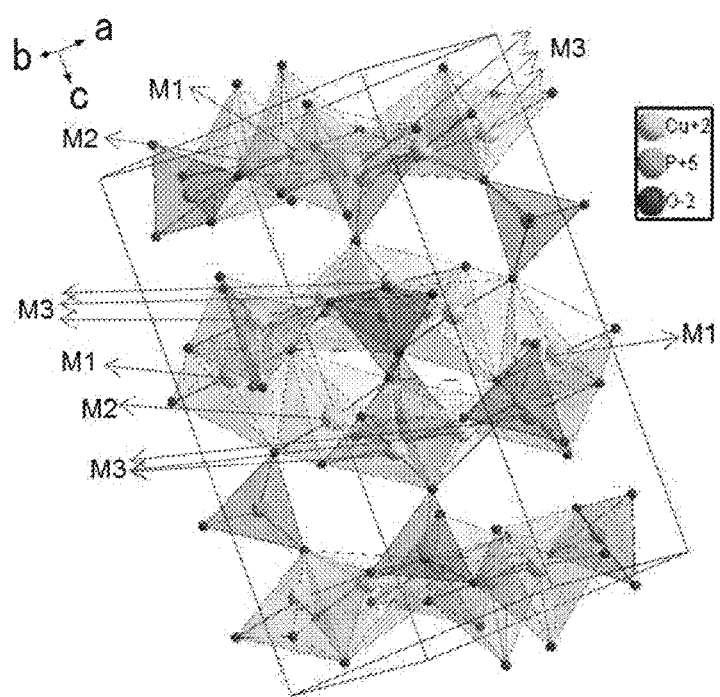
FIG. 7 schematically shows a steric structure belonging to a Pnma space group of the phosphate represented by Chemical Formula 4 included in the composition for forming a conductive pattern according to still another embodiment.

Meanwhile, referring to FIG. 7, the copper ions in $Cu_4P_2O_9$ may be positioned at the M1, M2, and M3 sites, and the copper ions positioned at the M1, M2, and M3 sites may be coordinated by five oxygens to form the local symmetry of the pentahedron. In addition, P may achieve the local symmetry of the tetrahedron together with four oxygens. The $Cu_4P_2O_9$ may have a steric structure in which the pentahedral $CuO_5$ and the tetrahedral $PO_4$ are three-dimensionally connected while sharing oxygens. The steric structure may be referred to as a Pnma space group structure.

The $P\bar{1}$ space group structure or the Pnma space group structure of the phosphate represented by Chemical Formula 4 includes the local symmetry of the pentahedron formed by $CuO_5$ as described above, wherein the local symmetry site is the non-centrosymmetric site, and thus, the copper ions positioned at the site are capable of achieving the Laporte allowed transition. The transition between energy levels resulted from this crystal structure of $Cu_4P_2O_9$ is mostly generated in the near infrared region to the infrared region. Accordingly, the non-conductive metal compound has a low absorbance in the visible light region and a high absorbance in the near infrared region to the infrared region, thereby having a bright color, and being sensitively reacted to the electromagnetic wave having a near infrared wavelength, and thus, the metal nucleus may be more excellently formed.

The phosphates represented by Chemical Formulas 1 to 4 have excellent compatibility with the polymer resin, and are also chemically stable to a solution used for reduction, a plating treatment, or the like, thereby having a characteristic of maintaining non-conductivity. Accordingly, in a region which is not irradiated with the electromagnetic waves, the non-conductive metal compound may be chemically stably maintained in a state in which the compound is uniformly dispersed in the polymer resin substrate, thereby exhibiting non-conductivity. On the other hand, in the predetermined region irradiated with the electromagnetic waves, the metal nucleus may be easily formed from the non-conductive metal compound by the above-described principle, and thus, the fine conductive pattern may be easily formed.

Therefore, when the composition of an embodiment is used, the fine conductive pattern may be formed on various polymer resin substrates such as polymer resin products, resin layers, or the like, using a very simplified process of irradiating electromagnetic waves such as a laser, etc.

In addition, the non-conductive metal compound included in the composition according to an embodiment exhibits a bright color, and thus, it is possible to stably implement the polymer resin products or the resin layers with various colors such as white, gray, etc., even by using a relatively small content of color additives.

As an example, compounds such as $CuCr_2O_4$, etc., having a spinel structure exhibit dark black, and thus, a composition including such a non-conductive metal compound may not be suitable for implementing the polymer resin products or the resin layers with various colors. On the other hand, the phosphates represented by Chemical Formulas 1 to 4 have a bright color, and thus, it is possible to more stably implement the polymer resin products with various colors such as white, gray, etc., by using a small content of color additives. Accordingly, when the phosphates represented by Chemical Formulas 1 to 4 having the above-described steric structure are used as the non-conductive metal compound, it is possible to more effectively satisfy demand of the related art to realize various colors in various polymer resin products, etc.

The non-conductive metal compound included in the composition according to an embodiment may be at least one or two phosphates represented by Chemical Formulas 1 to 4. Among them, $CuSn_2$, $Cu_3P_2O_8$, $Cu_2P_2O_7$, $Cu_4P_2O_9$, etc., are usable to more easily form the metal nucleus and the adhesion-activated surface, to provide resin products or resin layers with various colors, and to secure heat stability through excellent heat dissipation effect as compared to a case when the heat-dissipating material is used alone.

An average particle size of the non-conductive metal compound included in the composition according to an embodiment may be controlled to about 0.1 to 6 μm. The non-conductive metal compound may exhibit excellent compatibility with the polymer resin, exhibit non-conductivity in the region which is not irradiated with the electromagnetic waves, and may selectively form the metal nucleus only in the region irradiated with the electromagnetic waves, thereby uniformly forming the fine conductive pattern.

In the composition according to an embodiment, the non-conductive metal compound may have a content of about 0.1 to 10 wt % based on the total composition. According to the content range, the characteristic in which the conductive pattern is formed in the predetermined region by the irradiation of the electromagnetic waves may be preferably exhibited while appropriately maintaining basic physical properties such as mechanical properties, etc., of the polymer resin product or the resin layer formed from the composition.

Meanwhile, the composition according to an embodiment may include the heat-dissipating material to exhibit excellent heat conductivity and heat diffusivity. Accordingly, when the composition according to an embodiment is used, it is possible to omit a conventional heat dissipation structure such as a heat dissipation body or a heat dissipation layer, thereby providing a simplified electronic product, etc.

Figure 8:
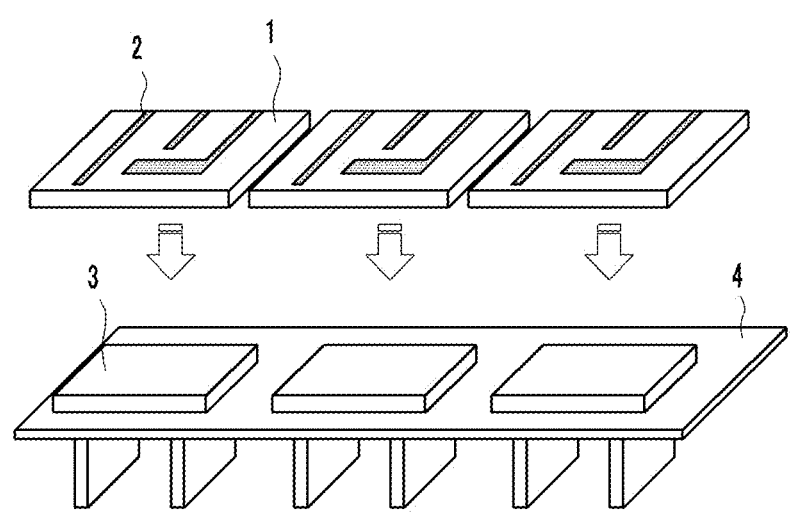
FIG. 8 schematically shows a structure of a conventional electronic component substrate.
Figure 9:
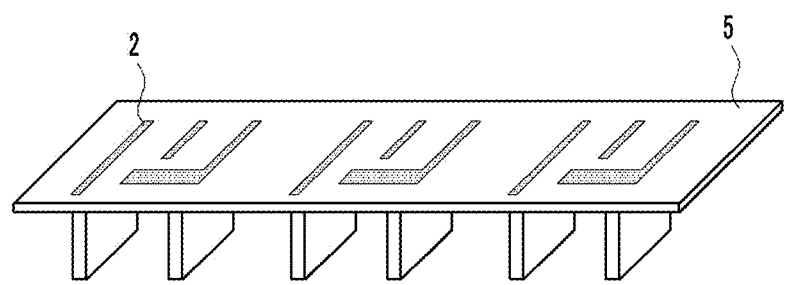
FIG. 9 schematically shows a structure of an electronic component substrate manufactured using the composition for forming a conductive pattern according to an embodiment of the present invention.

More specifically, a conventional electronic component substrate essentially adopts a heat sink 3 to prevent an increase in temperature of a PCB substrate 1, as shown in FIG. 8.

However, when the composition according to an embodiment is used to mold a conventional polymer resin product in a blanket 4 shape, and irradiated with electromagnetic waves such as a laser, etc., followed by reduction or plating treatment, etc., it is possible to provide an electronic component substrate 5 on which a fine conductive pattern 2 is formed while exhibiting excellent heat dissipation characteristic. Accordingly, the conventional PCB substrate 1, the heat sink 3, and the blanket 4 may be integrated by using the composition according to an embodiment.

In the composition according to an embodiment, a carbide, a carbon-based material, a nitride-based material, a metal oxide, or a mixture thereof may be included as the heat-dissipating material. More specifically, silicon carbide (SiC), etc., may be included as the carbide, carbon black, carbon nanotube (CNT), graphite, graphene, or a mixture thereof, etc., may be included as the carbon-based material, boron nitride (BN), silicon nitride ($Si_3B_4$), aluminum nitride (AlN) or a mixture thereof, etc., may be included as the nitride-based material, or magnesium oxide (MgO), aluminum oxide ($Al_2O_3$), beryllium oxide (BeO), zinc oxide (ZnO), or a mixture thereof, etc., may be included as the metal oxide.

Such a heat-dissipating material has excellent compatibility with the polymer resin without having an effect on forming the metal nucleus by the irradiation of the electromagnetic waves of the non-conductive metal compound, thereby providing the resin product or the resin layer having excellent heat dissipation characteristics in which good conductivity patterns are formed.

In the composition according to an embodiment, the heat-dissipating material may have a content ranging from about 0.1 to about 50 wt % based on the total composition to exhibit a desired level of heat dissipation characteristics. Here, when the heat-dissipating material is the carbide or the carbon-based material, the content of the heat-dissipating material may be controlled to 0.1 to 20 wt % to maintain an insulation characteristic. According to the content range, a predetermined level of heat diffusivity and heat conductivity may be preferably exhibited while appropriately maintaining basic physical properties of the polymer resin products or the resin layers formed from the composition.

Meanwhile, in the composition for forming a conductive pattern according to an embodiment, any thermosetting resin or any thermoplastic resin capable of forming various polymer resin products or resin layers is usable as the polymer resin without particular limitation. In particular, the non-conductive metal compound described above may exhibit excellent compatibility with various polymer resins and uniform dispersibility, and the composition of an embodiment may include various polymer resins and may be molded into various resin products or resin layers. Specific examples of the polymer resin may include an acrylonitrile poly-butadiene styrene (ABS) resin, a polyalkylene terephthalate resin such as a polybutylene terephthalate resin, a polyethylene terephthalate resin, or the like, a polyamide resin, a polyphenylether resin, a polyphenylene sulfide resin, a polycarbonate resin, a polypropylene resin, and a polyphthalamide resin, etc., and may also include various other polymer resins.

Further, in the composition for forming a conductive pattern, the non-conductive metal compound may have a content of about 0.1 to 10 wt % based on the total composition, and the heat-dissipating material may have a content of about 1 to 50 wt % based on the total composition, and the polymer resin may have a residual content. Here, when the heat-dissipating material is the carbide and/or the carbon-based material, the heat-dissipating material may have a content of about 1 to 20 wt % based on the total composition, and the polymer resin may have the residual content.

According to the content range, the characteristic in which the conductive pattern is formed in the predetermined region by the irradiation of the electromagnetic waves and the heat dissipation characteristic may be preferably exhibited while appropriately maintaining basic physical properties such as mechanical properties, etc., of the polymer resin product or the resin layer formed from the composition.

In addition, the composition for forming a conductive pattern may further include at least one additive selected from the group consisting of a flame retardant, a heat stabilizer, a ultraviolet (UV) stabilizer, a lubricant, an anti-oxidant, an inorganic filler, a color additive, an impact-reinforcing agent, and a functional reinforcing agent, in addition to the above-described polymer resin and the predetermined non-conductive metal compound, and the heat-dissipating material. By adding the additives, physical properties of the resin structure obtained from the composition of an embodiment may be appropriately reinforced. In the additives, the color additive, for example, pigment, etc., may have a content of about 0.1 to 10 wt % or about 1 to 10 wt % to provide a desired color to the resin structure.

Representative examples of the color additives such as the pigment, etc., include white pigments such as ZnO, ZnS, Talc, $TiO_2$, $SnO_2$, and $BaSO_4$, etc. Other color additives such as various kinds and colors of pigments that are known to be usable in polymer resin compositions from the past may also be used.

The flame retardant may include a phosphorous-based flame retardant and an inorganic flame retardant. More specifically, the phosphorous-based flame retardant may include phosphate ester-based flame retardants such as triphenyl phosphate (TPP), trixylenyl phosphate (TXP), tricresyl phosphate (TCP), triisophenyl phosphate (REOFOS), etc.; aromatic polyphosphate-based flame retardants; polyphosphate-based flame retardants; or red phosphorous-based flame retardant, etc., and various other phosphorous-based flame retardants known to be usable in a resin composition may also be used without particular limitations. In addition, the inorganic flame retardant may include aluminum hydroxide, magnesium hydroxide, zinc borate, molybdenum oxide ($MoO_3$), molybdenum peroxide salt ($Mo_2O_7^{2-}$), calcium-zinc-molybdate, antimony trioxide ($Sb_2O_3$), antimony pentoxide ($Sb_2O_5$), etc. However, the examples of the inorganic flame retardant are not limited thereto, and all of various inorganic flame retardants known to be usable in other resin compositions may be used without particular limitation.

In addition, the impact-reinforcing agent, etc., may have a content of about 1 to 12 wt %, and the heat stabilizer, the UV stabilizer, the lubricant, the anti-oxidant, or the like, may have a content of about 0.05 to 5 wt %, thereby appropriately expressing desired physical properties in the resin structure.

Meanwhile, a method of forming a conductive pattern on polymer resin substrates such as resin products, resin layers, or the like, by direct irradiation of electromagnetic waves by using the composition for forming a conductive pattern according to an embodiment as described above is specifically described below. The method of forming a conductive pattern may include: molding the above-described composition for forming a conductive pattern into a resin product or applying the composition to another product to form a resin layer; generating a metal nucleus from non-conductive metal compound particles by irradiating a predetermined region of the resin product or the resin layer with electromagnetic waves; and chemically reducing or plating the region in which the metal nucleus is generated to form a conductive metal layer.

The method of forming a conductive pattern is described below for each step with reference to the accompanying drawings. For reference, in FIG. 10, one example of the method of forming a conductive pattern is shown for each process step in a simplified manner.

In the method of forming a conductive pattern, first, the composition for forming a conductive pattern described above may be molded into the resin product or applied to another product to form the resin layer. In molding the resin product or forming the resin layer, conventional methods of molding a product or conventional methods of forming a resin layer using a polymer resin composition may be applied without particular limitation. For example, in molding the resin product by using the composition, the composition for forming a conductive pattern may be extruded, cooled, and formed into pellet or particle forms, and then injection-molded into a desired shape to manufacture various polymer resin products.

The polymer resin product or the resin layer as formed above may have a form in which the specific non-conductive metal compound and the heat-dissipating material are uniformly dispersed on the resin substrate formed from the polymer resin. In particular, since the phosphates represented by Chemical Formulas 1 to 4 have excellent compatibility with various polymer resins and chemical stability, the phosphates may be uniformly dispersed over an entire area of the resin substrate and may be maintained in a non-conductive state.

Figure 10:
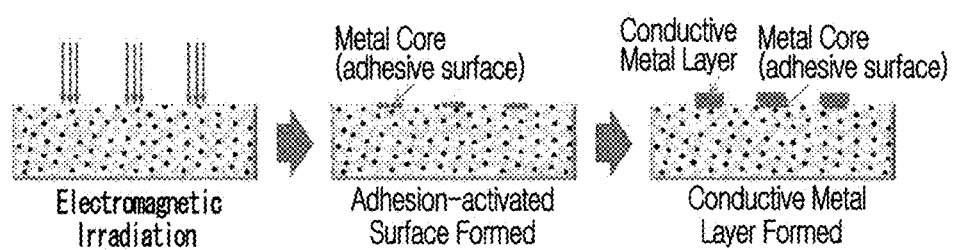
FIG. 10 is a view briefly showing an example of a method of forming a conductive pattern using the composition for forming a conductive pattern according to an embodiment of the present invention, for each process step.

After the polymer resin product or the resin layer is formed, the predetermined region of the resin product or the resin layer to be formed with the conductive pattern may be irradiated with the electromagnetic waves such as a laser, etc., as shown in a first drawing of FIG. 10. By the irradiation of the electromagnetic waves, the metal nucleus may be easily generated from the non-conductive metal compound (see a second drawing of FIG. 10).

More specifically, when the metal nucleus is generated by the irradiation of the electromagnetic waves, a portion of the non-conductive metal compound may be exposed to a surface of the predetermined region of the resin product or the resin layer to generate the metal nucleus therefrom, and to form an adhesion-activated surface which is activated to have higher adherence. As the adhesion-activated surface is selectively formed only in the predetermined region irradiated with the electromagnetic waves, when the reducing step, plating step, or the like, to be described later is performed, conductive metal ions included in the metal nucleus, and the adhesion-activated surface, etc., are chemically reduced, and thus, the conductive metal layer may be selectively formed on the predetermined region of the polymer resin substrate.

On the other hand, in the above-described step of generating the metal nucleus, laser electromagnetic waves in the near infrared region among the electromagnetic waves, may be irradiated. For example, a laser electromagnetic wave having a wavelength of about 1000 nm to 1200 nm or about 1060 nm to 1070 nm, or having a wavelength of about 1064 nm may be irradiated at an average power of about 1 to 20 W, or about 3 to 10 W.

Irradiation conditions of the electromagnetic waves such as a laser, etc., are controlled within the above-described range, and thus, the metal nucleus and the adhesion-activated surface including the metal nucleus, etc., may be more excellently formed from the non-conductive metal compound, thereby making it possible to form a more excellent conductive pattern. However, the irradiation conditions of the electromagnetic waves enabling the formation of metal nucleus, etc., may be controlled differently depending on specific kinds of the non-conductive metal compound and the polymer resin that are actually used or compositions thereof.

On the other hand, after the metal nucleus is generated as described above, the region in which the metal nucleus is generated may be subjected to chemical reduction or plating to form the conductive metal layer, as shown in a third drawing of FIG. 10. As a result of the reducing or plating step, the conductive metal layer may be selectively formed in the predetermined region where the metal nucleus and the adhesion-activated surface are exposed, and the non-conductive metal compound, which is chemically stable, may maintain non-conductivity as it is in the remaining region. Accordingly, the fine conductive pattern may be selectively formed only in the predetermined region on the polymer resin substrate.

In the reducing or plating step, the resin product or the resin layer which generates the metal nucleus may be treated with an acidic solution or a basic solution including a reducing agent. This solution may include at least one selected from the group consisting of formaldehyde, hypophosphite, dimethylaminoborane (DMAB), diethylaminoborane (DEAB), and hydrazine, as the reducing agent. In another example, in the reducing or plating step, the resin product or the resin layer that generates the metal nucleus may be treated with an electroless plating solution including the reducing agent and the conductive metal ion, etc.

By performing the reducing or plating step as described above, the metal ion included in the metal nucleus may be reduced or the conductive metal ion included in the electroless plating solution may be chemically reduced by using the metal nucleus as a seed in a region where the metal nucleus is formed, and thus, an excellent conductive pattern may be selectively formed in the predetermined region. At this time, the metal nucleus and the adhesion-activated surface may form a strong bond with the chemically reduced conductive metal ion, and as a result, the conductive pattern may be selectively and more easily formed in the predetermined region.

Meanwhile, according to another embodiment of the present invention, there is provided a resin structure having a conductive pattern obtained by the composition for forming a conductive pattern and the method of forming a conductive pattern as described above. The resin structure may include: a polymer resin substrate; a non-conductive metal compound including at least one phosphate selected from the group consisting of phosphates represented by Chemical Formulas 1 to 4 dispersed in the polymer resin substrate; a carbide, a carbon-based material, a nitride-based material, a metal oxide or a mixture thereof as a heat-dissipating material dispersed in the polymer resin substrate; an adhesion-activated surface including a metal nucleus exposed on a surface of a predetermined region of the polymer resin substrate; and a conductive metal layer formed on the adhesion-activated surface.

In the resin structure, the predetermined region in which the adhesion-activated surface and the conductive metal layer are formed may correspond to a region irradiated with electromagnetic waves on the polymer resin substrate. In addition, the metal included in the metal nucleus of the adhesion-activated surface or the ion thereof may be derived from the non-conductive metal compound. On the other hand, the conductive metal layer may be derived from the metal included in the non-conductive metal compound or may be derived from the conductive metal ion included in the electroless plating solution.

Further, the resin structure may further include a residue derived from the non-conductive metal compound. The residue may have a structure in which at least a portion of the metal included in the non-conductive metal compound is released, and thus, vacancy is formed in at least a portion of the site.

The above-described resin structure may be manufactured into various resin products such as cell phones having conductive patterns for antennas, tablet PC cases, and automobile components, etc., or resin layers, or various resin products having conductive patterns such as other RFID tags, various sensors, MEMS structures, or the like, or resin layers.

As described above, according to embodiments of the present invention, it is possible to excellently and easily form various resin products having various fine conductive patterns by a very simplified method including the irradiation of electromagnetic waves such as a laser, etc., followed by reduction or plating while exhibiting excellent heat dissipation characteristic.

Hereinafter, action and effects of the present invention are described by specific Examples of the present invention in more detail. Meanwhile, these Examples are provided by way of example, and therefore, should not be construed as limiting the scope of the present invention.

Example 1: Formation of Conductive Pattern by Direct Laser Irradiation

A composition for forming a conductive pattern by irradiation of electromagnetic waves was prepared by using a polybutyleneterephthalate resin as a basic resin, graphite as a heat-dissipating material, and $Cu_3P_2O_8$ as a non-conductive metal compound, and using heat stabilizers (IR1076, PEP36), a UV stabilizer (UV329), a lubricant (EP184) and an impact-reinforcing agent (S2001) together as additives for processes and stabilization. Specifically, a composition was obtained by mixing 69 wt % of the polybutyleneterephthalate resin, 5 wt % of the non-conductive metal compound, 15 wt % of the graphite, 10 wt % of the impact-reinforcing agent, and 1 wt % of other additives including the lubricant.

The composition prepared above was extruded through an extruder at a temperature of 260 to 280° C. The extruded composition in a pellet form was injection molded into a substrate having a size of a diameter of 100 mm and a thickness of 2 mm at about 260 to 270° C.

On the other hand, the resin substrate manufactured as above was irradiated with a laser having a wavelength band of 1064 nm under a condition of 40 kHz and 4 W by using an Nd—YAG laser apparatus, thereby activating a surface. Then, a resin structure in which the surface was activated by laser irradiation was subjected to an electroless plating process as follows.

The plating solution was prepared using MSMID-70 supplied by MSC Company, and a preparation process thereof is as follows. 40 ml of Cu solution (MSMID-70A), 120 ml of complexing agent (MSMID-70B), 3.5 ml of auxiliary complexing agent (MSMID-70C), and 2 ml of stabilizer (MSMID-70D) were dissolved in 700 ml of deionized water, thereby preparing a Cu plating solution. 45 ml of 25% NaOH and 12 ml of 37% formaldehyde were added to 1 L of the prepared plating solution. The resin structure having the surface activated by the laser was supported on the plating solution for 3 to 5 hours, and then washed with distilled water.

The resin structure irradiated with the laser had a good conductive pattern (or a plating layer) formed on a surface of an adhesion-activated surface including the metal nucleus through the electroless plating.

Example 2: Formation of Conductive Pattern by Direct Laser Irradiation

A composition for forming a conductive pattern was prepared in the same manner as in Example 1, except that boron nitride (BN) was used instead of the graphite as the heat-dissipating material, and a resin structure having a conductive pattern was manufactured from the composition for forming a conductive pattern.

Example 3: Formation of Conductive Pattern by Direct Laser Irradiation

A composition for forming a conductive pattern was prepared in the same manner as in Example 1, except that $Cu_4P_2O_9$ was used instead of the $Cu_3P_2O_8$ as the non-conductive metal compound, and a resin structure having a conductive pattern was manufactured from the composition for forming a conductive pattern.

Comparative Example 1: Formation of Conductive Pattern by Direct Laser Irradiation A composition for forming a conductive pattern was prepared in the same manner as in Example 1, except that the heat-dissipating material was not added and a content of the polybutyleneterephthalate resin was 84 wt %, and a resin structure having a conductive pattern was manufactured from the composition for forming a conductive pattern.

Comparative Example 2: Formation of Conductive Pattern by Direct Laser Irradiation A composition for forming a conductive pattern was prepared in the same manner as in Example 1, except that the non-conductive metal compound was not added and a content of the polybutyleneterephthalate resin was 74 wt %, and a resin structure having a conductive pattern was manufactured from the composition for forming a conductive pattern.

Comparative Example 3: Formation of Conductive Pattern by Direct Laser Irradiation A composition for forming a conductive pattern was prepared in the same manner as in Example 1, except that $Cu_2(OH)PO_4$ was used instead of the $Cu_3P_2O_8$ as the non-conductive metal compound, and a resin structure having a conductive pattern was manufactured from the composition for forming a conductive pattern.

Experimental Example: Evaluation of Physical Properties of Resin Structure Having Conductive Pattern (1) Adhesion performance of the conductive patterns (or the plating layer) formed on the resin structure of Examples and Comparative Examples was evaluated by a cross-cut test according to ISO 2409 standard method. In the adherence test according to the ISO 2409 standard method, Class 0 indicates that a peeled area of the conductive pattern is 0% of an area of the conductive pattern to be evaluated, and Class 1 indicates that the peeled area of the conductive pattern is more than 0% to 5% or less of the area of the conductive pattern to be evaluated. Class 2 indicates that the peeled area of the conductive pattern is more than 5% to 15% or less of the area of the conductive pattern to be evaluated. Class 3 indicates that the peeled area of the conductive pattern is more than 15% to 35% or less of the area of the conductive pattern to be evaluated. Class 4 indicates that the peeled area of the conductive pattern is more than 35% to 65% or less of the area of the conductive pattern to be evaluated. Class 5 indicates that the peeled area of the conductive pattern is more than 65% of the area of the conductive pattern to be evaluated.

(2) Heat conductivity of the resin structures of Examples and Comparative Examples was evaluated by ASTM E1461 standard method, and LFA447 laser flash (Netzsch) was used as a test equipment. The specimen was placed inside the test equipment, and heat was generated at the bottom of the specimen by using a laser pulse. Then, heat diffusivity was measured by measuring a temperature on the opposite side of the specimen using an IR sensor, and then, heat conductivity was calculated from the heat diffusivity.

(3) A heat distortion temperature of the resin structures of Examples and Comparative Examples was evaluated by a 6M-2 (Toyoseiki) test equipment. A load determined by a size of the specimen was applied to the specimen (a load of 4.6 kgf/cm$^2$ was applied in this test example), and the specimen was immersed in oil, and the oil was heated at a rate of 120° C./hr after preheating for 3 to 5 minutes. As a temperature of the oil was increased, the specimen drooped, wherein a temperature when the specimen drooped by 0.254 mm was measured and defined as the heat distortion temperature.

TABLE 1

| | Evaluation of adherence | Heat conductivity [W/mK] | Heat distortion temperature [° C. @ 6.4 mm, 4.6 kgf/cm$^2$] |
| --- | --- | --- | --- |
| Example 1 | Class 0 | 1.77 | 193.9 |
| Example 2 | Class 0 | 1.82 | 193.2 |
| Example 3 | Class 0 | 1.80 | 192.7 |
| Comparative Example 1 | Class 0 | 1.07 | 128.0 |
| Comparative Example 2 | Class 5 | 1.69 | 191.3 |
| Comparative Example 3 | Class 3 | 1.45 | 192.2 |

Referring to Table 1, the peeled area of the conductive pattern (or plating layer) formed according to Examples 1 to 3 and Comparative Example 1 was about 0% (ISO Class 0) of the area of the conductive pattern to be tested, and thus, it was confirmed that the conductive pattern showing high adherence was excellently formed in the region irradiated with the laser. On the other hand, the peeled area of the conductive pattern formed according to Comparative Example 2 was more than 65% (ISO Class 5) of the area of the conductive pattern to be tested, and the peeled area of the conductive pattern formed according to Comparative Example 3 was more than 15% to 35% or less (ISO Class 3) of the area of the conductive pattern to be tested, and thus, it was confirmed that adherence of the conductive patterns of Comparative Examples 2 and 3 to the resin structure was remarkably low as compared to those of Examples 1 to 3.

Meanwhile, the resin structure of Comparative Example 1 in which $Cu_3P_2O_8$ was added as the non-conductive metal compound and the heat-dissipating material was not added, had the conductive pattern excellently formed by the irradiation of the electromagnetic waves, but had extremely low heat conductivity and heat distortion temperature of the resin. On the other hand, the resin structures of Examples 1 to 3 using $Cu_3P_2O_8$ or $Cu_4P_2O_9$ as the non-conductive metal compound and using the graphite or BN as the heat-dissipating material had the conductive pattern excellently formed by the irradiation of the electromagnetic waves, and had more excellent heat conductivity and increased heat distortion temperature as compared to the resin structure of Comparative Example 2 using only the heat-dissipating material. In addition, the resin structure of Comparative Example 3 in which the non-conductive metal compound which is not included in the non-conductive metal compound of the present invention and the heat-dissipating material were added had a lower heat conductivity than that of the resin structure of Comparative Example 2 using only the heat-dissipating material. Therefore, it was confirmed that the non-conductive metal compound proposed in the present invention was combined with the heat-dissipating material to exhibit a more improved heat dissipation effect than that of the heat-dissipating material itself while maintaining high adherence of the conductive pattern.

DESCRIPTION OF SYMBOLS

1: PCB substrate
2: Conductive pattern (circuit pattern)
3: Heat sink
4: Blanket
5: Electronic component substrate

What is claimed is:

1. A composition for forming a conductive pattern by irradiation of electromagnetic waves, comprising:
   a polymer resin;
   a non-conductive metal compound including at least one phosphate selected from the group consisting of phosphates represented by Chemical Formulas 1 to 4 below; and
   a carbide, a carbon-based material, a nitride-based material, a metal oxide, or a mixture thereof as a heat-dissipating material,
   wherein a metal nucleus is formed from the non-conductive metal compound by the irradiation of the electromagnetic waves:

$$A_xB_2P_3O_{12} \quad \text{[Chemical Formula 1]}$$

$$Cu_{3-y}M^1{}_yP_2O_8 \quad \text{[Chemical Formula 2]}$$

$$Cu_{2-z}M^2{}_zP_2O_7 \quad \text{[Chemical Formula 3]}$$

$$Cu_4P_2O_9 \quad \text{[Chemical Formula 4]}$$

in Chemical Formula 1, x is a rational number from 0.5 to 1, A is at least one metal selected from the group consisting of Li, Na, Cu, Ag and Au, and B is at least one metal selected from the group consisting of Sn, Ti, Zn and Hf, in Chemical Formula 2, y is a rational number from 0 to less than 3, $M^1$ is at least one metal selected from the group consisting of Ti, V, Cr, Mn, Fe, Co, Ni, Y, Zn, Nb, Mo, Tc, Pd, Ag, Ta, W, Pt and Au, and in Chemical Formula 3, z is a rational number from 0 to less than 2, $M^2$ is at least one metal selected from the group consisting of Zn, Mg, Ca, Sr and Ba.

2. The composition for forming a conductive pattern by irradiation of electromagnetic waves of claim 1, wherein:
the phosphate represented by Chemical Formula 1 has a trigonal structure of $R\bar{3}c$ space group.

3. The composition for forming a conductive pattern by irradiation of electromagnetic waves of claim 1, wherein:
the phosphate represented by Chemical Formula 1 has a triclinic structure of $P\bar{1}$ space group or a monoclinic structure of Cc or C2/c space group.

4. The composition for forming a conductive pattern by irradiation of electromagnetic waves of claim 1, wherein:
the phosphate represented by Chemical Formula 2 has a triclinic structure of $P\bar{1}$ space group.

5. The composition for forming a conductive pattern by irradiation of electromagnetic waves of claim 1, wherein:
the phosphate represented by Chemical Formula 3 includes a structure in which Cu or $M^2$ is surrounded by five oxygen atoms in a distorted square pyramid form; or a structure in which Cu or M is surrounded by six oxygen atoms in a distorted octahedron form.

6. The composition for forming a conductive pattern by irradiation of electromagnetic waves of claim 1, wherein:
the phosphate represented by Chemical Formula 4 has a triclinic structure of $P\bar{1}$ space group or an orthorhombic structure of Pnma space group.

7. The composition for forming a conductive pattern by irradiation of electromagnetic waves of claim 1, wherein:
the non-conductive metal compound has an average particle size of 0.1 to 6 μm.

8. The composition for forming a conductive pattern by irradiation of electromagnetic waves of claim 1, wherein:
the heat-dissipating material includes silicon carbide as the carbide; carbon black, carbon nanotube, graphite, graphene, or a mixture thereof as the carbon-based material; boron nitride, silicon nitride, aluminum nitride or a mixture thereof as the nitride-based material; or magnesium oxide, aluminum oxide, beryllium oxide, zinc oxide, or a mixture thereof as the metal oxide.

9. The composition for forming a conductive pattern by irradiation of electromagnetic waves of claim 1, wherein:
the polymer resin includes a thermosetting resin or a thermoplastic resin.

10. The composition for forming a conductive pattern by irradiation of electromagnetic waves of claim 1, wherein:
the polymer resin includes at least one selected from the group consisting of an acrylonitrile poly-butadiene styrene (ABS) resin, a polyalkylene terephthalate resin, a polyamide resin, a polyphenylether resin, a polyphenylene sulfide resin, a polycarbonate resin, a polypropylene resin, and a polyphthalamide resin.

11. The composition for forming a conductive pattern by irradiation of electromagnetic waves of claim 1, wherein:
the non-conductive metal compound has a content of 0.1 to 10 wt % based on the total composition, the heat-dissipating material has a content of 1 to 50 wt % based on the total composition, and the polymer resin has a residual content.

12. The composition for forming a conductive pattern by irradiation of electromagnetic waves of claim 1, further comprising:
at least one additive selected from the group consisting of a flame retardant, a heat stabilizer, a ultraviolet (UV) stabilizer, a lubricant, an anti-oxidant, an inorganic filler, a color additive, an impact-reinforcing agent, and a functional reinforcing agent.

13. A resin structure having a conductive pattern comprising:
a polymer resin substrate;
a non-conductive metal compound including at least one phosphate selected from the group consisting of phosphates represented by Chemical Formulas 1 to 4 below dispersed in the polymer resin substrate;
a carbide, a carbon-based material, a nitride-based material, a metal oxide or a mixture thereof as a heat-dissipating material dispersed in the polymer resin substrate;
an adhesion-activated surface including a metal nucleus exposed on a surface of a predetermined region of the polymer resin substrate; and
a conductive metal layer formed on the adhesion-activated surface:

$A_xB_2P_3O_{12}$     [Chemical Formula 1]

$Cu_{3-y}M^1_yP_2O_8$     [Chemical Formula 2]

$Cu_{2-z}M^2_zP_2O_7$     [Chemical Formula 3]

$Cu_4P_2O_9$     [Chemical Formula 4]

in Chemical Formula 1, x is a rational number from 0.5 to 1, A is at least one metal selected from the group consisting of Li, Na, Cu, Ag and Au, and B is at least one metal selected from the group consisting of Sn, Ti, Zn and Hf, in Chemical Formula 2, y is a rational number from 0 to less than 3, $M^1$ is at least one metal selected from the group consisting of Ti, V, Cr, Mn, Fe, Co, Ni, Y, Zn, Nb, Mo, Tc, Pd, Ag, Ta, W, Pt and Au, and in Chemical Formula 3, z is a rational number from 0 to less than 2, $M^2$ is at least one metal selected from the group consisting of Zn, Mg, Ca, Sr and Ba.

14. The resin structure having a conductive pattern of claim 13, wherein:
the predetermined region in which the adhesion-activated surface and the conductive metal layer are formed corresponds to a region irradiated with electromagnetic waves on the polymer resin substrate.

* * * * *